United States Patent
Kim et al.

(10) Patent No.: US 9,735,365 B2
(45) Date of Patent: Aug. 15, 2017

(54) LOW BAND GAP POLYMER COMPOUND, SYNTHESIS OF THEREOF, AND ORGANIC PHOTOVOLTAIC CELL CONTAINING THE SAME

(71) Applicant: KOREA INSTITUTE OF SCIENCE AND TECHNOLOGY, Seoul (KR)

(72) Inventors: Bong Soo Kim, Seoul (KR); Hyo Sang Lee, Seoul (KR); Hong Gon Kim, Seoul (KR); Min Jae Ko, Seoul (KR); Doh-Kwon Lee, Seoul (KR); Jin Young Kim, Seoul (KR); Hae Jung Son, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 175 days.

(21) Appl. No.: 14/578,948

(22) Filed: Dec. 22, 2014

(65) Prior Publication Data
US 2016/0020336 A1    Jan. 21, 2016

(30) Foreign Application Priority Data
Jul. 21, 2014   (KR) .................. 10-2014-0092055

(51) Int. Cl.
*H01B 1/12*   (2006.01)
*H01L 51/00*   (2006.01)
(Continued)

(52) U.S. Cl.
CPC ......... *H01L 51/0036* (2013.01); *H01B 1/124* (2013.01); *H01L 51/0043* (2013.01);
(Continued)

(58) Field of Classification Search
CPC ......... H01L 2031/0344; H01L 51/0036; H01L 51/0037; H01L 51/0043; H01L 51/0047; H01L 51/4253; Y02E 10/549; H01B 1/124
See application file for complete search history.

(56) References Cited

U.S. PATENT DOCUMENTS

| | | | |
|---|---|---|---|
| 2008/0087324 A1* | 4/2008 | Gaudiana | C08G 61/123 136/261 |
| 2012/0152357 A1* | 6/2012 | Brown | C07D 285/14 136/263 |

(Continued)

FOREIGN PATENT DOCUMENTS

| | | | |
|---|---|---|---|
| JP | WO2013065573 A1 | 4/2015 | |
| WO | WO 2013/119022 | * 8/2013 | ............. C08G 61/12 |

OTHER PUBLICATIONS

Selvam Subramaniyan et al.; "New Thiazolothiazole Copolymer Semiconductors for Highly Efficient Solar Cells", Macromolecules Jul. 2011, vol. 44. pp. 6245-6248.
(Continued)

*Primary Examiner* — Mark Kopec
*Assistant Examiner* — Jaison Thomas
(74) *Attorney, Agent, or Firm* — Ladas & Parry LLP; Loren K. Thompson

(57) ABSTRACT

The present disclosure relates to a novel polymer compound and a method for preparing the same. More particularly, the present disclosure relates to a novel conductive low band gap electron donor polymer compound having high photon absorptivity and improved hole mobility, a method for preparing the same and an organic photovoltaic cell containing the same. Since the conductive polymer compound as a low band gap electron donor exhibits high photon absorptivity and superior hole mobility, it can be usefully used as a material for an organic optoelectronic device such as an organic photodiode (OPD), an organic thin-film tran-
(Continued)

sistor (OTFT), an organic light-emitting diode (OLED), an organic photovoltaic cell, etc. as well as in the development of a n-type material.

7 Claims, 4 Drawing Sheets

(51) Int. Cl.
    *H01L 51/42*     (2006.01)
    *H01L 31/0256*     (2006.01)

(52) U.S. Cl.
    CPC ...... *H01L 51/0037* (2013.01); *H01L 51/0047* (2013.01); *H01L 51/4253* (2013.01); *H01L 2031/0344* (2013.01); *Y02E 10/549* (2013.01)

(56) References Cited

U.S. PATENT DOCUMENTS

2012/0273732 A1* 11/2012 Jenekhe ............... C08G 61/123
    252/500
2013/0167929 A1* 7/2013 Wen ..................... B82Y 10/00
    136/263
2014/0166942 A1* 6/2014 Izawa .................. H01L 51/0036
    252/511
2014/0290747 A1* 10/2014 Kim .................... H01L 51/0036
    136/263
2015/0144846 A1* 5/2015 Nanson ............... H01L 51/0036
    252/500
2016/0194439 A1* 7/2016 Qin ..................... C08G 61/126
    252/501.1

OTHER PUBLICATIONS

Gang Li, et al; "High-efficiency solution processable polymer photovoltaic cells by self-organization of polymer blends", Nature Materials, vol. 4, Nov. 2005, pp. 864-868.
Wanli Ma, et al; "Thermally Stable, Efficient Polymer Solar Cells with Nanoscale Control of the Interpenetrating Network Morphology", Advanced Functional Materials, vol. 15, pp. 1617-1622; Article first published online: Sep. 1, 2005.

* cited by examiner

LOW BAND GAP POLYMER COMPOUND, SYNTHESIS OF THEREOF, AND ORGANIC PHOTOVOLTAIC CELL CONTAINING THE SAME

CROSS-REFERENCE TO RELATED APPLICATIONS

This application claims priority under 35 U.S.C. §119 to Korean Patent Application No. 10-2014-0092055 filed on Jul. 21, 2014 in the Korean Intellectual Property Office, the disclosure of which is incorporated herein by reference in its entirety.

TECHNICAL FIELD

The present disclosure relates to a novel polymer compound and a method for preparing the same. More particularly, the present disclosure relates to a novel conductive low band gap electron donor polymer compound having high photon absorptivity and improved hole mobility, a method for preparing the same and an organic photovoltaic cell containing the same.

BACKGROUND

Recently, with the concerns about depletion of fossil resources as major energy sources and environmental problems such as the greenhouse effect caused by carbon dioxide emission resulting from combustion of the fossil resources, the importance of development of environment-friendly alternative energy is increasing. In an effort to overcome these problems, various energy sources including hydraulic and wind power are being studied. Also, the solar light is being studied as a new renewable energy source that can be used unlimitedly. A photovoltaic cell using the solar light can be largely classified into a photovoltaic cell using an inorganic material such as silicon and one using an organic material. Especially, a polymer-based organic thin-film photovoltaic cell is studied a lot for many advantages over a silicon-based inorganic photovoltaic cell, including low production cost, lightweightness, production by various methods including roll-to-roll processing and inkjet printing and production of large-sized flexible devices that can be bent freely. Typically, poly(3-hexylthiophene) (P3HT) is used for a photoconversion layer of an organic thin-film photovoltaic cell. When a device is fabricated using the compound together with a $C_{61}$ fullerene derivative having high electron affinity, it is reported that an efficiency of about 4-5% is achieved. However, the optical absorption wavelength of P3HT is limited to about 650 nm (G. Li, V. Shrotriya, J. S. Huang, Y. Yao, T. Moriarty, K. Emery and Y. Yang, *Nat. Mater.*, 2005, 4, 864-868; W. L. Ma, C. Y. Yang, X. Gong, K. Lee and A. J. Heeger, *Adv. Funct. Mater.*, 2005, 15, 1617-1622).

In order to overcome these problems and to fabricate a high-efficiency organic photovoltaic cell, development of a new low band gap polymer which exhibits a broad optical absorption wavelength, superior hole mobility and adequate molecular energy level is necessary.

SUMMARY

The present disclosure is directed to providing a new conductive low band gap polymer compound exhibiting a broad optical absorption wavelength, superior hole mobility and adequate molecular energy level and a method for preparing the same.

The present disclosure is also directed to providing a high-efficiency organic photovoltaic cell containing the conductive polymer compound.

In an aspect, the present disclosure provides a conductive low band gap polymer compound represented by Chemical Formula 1 and a method for preparing the same:

Chemical Formula 1

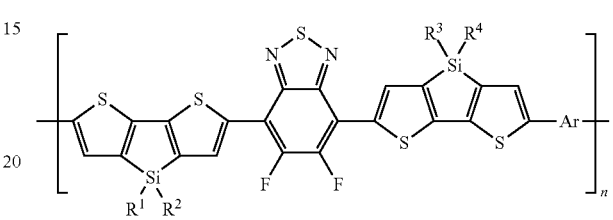

In Chemical Formula 1, $R^1$ through $R^4$, Ar and n are the same as defined in the detailed description.

In another aspect, the present disclosure provides a high-efficiency organic photovoltaic cell containing the conductive polymer compound represented by Chemical Formula 1.

Since the conductive polymer compound as a low band gap electron donor exhibits high photon absorptivity and superior hole mobility, it can be usefully used as a material for an organic optoelectronic device such as an organic photodiode (OPD), an organic thin-film transistor (OTFT), an organic light-emitting diode (OLED), an organic photovoltaic cell, etc. as well as in the development of a n-type material.

DETAILED DESCRIPTION OF EMBODIMENTS

Figure 1:
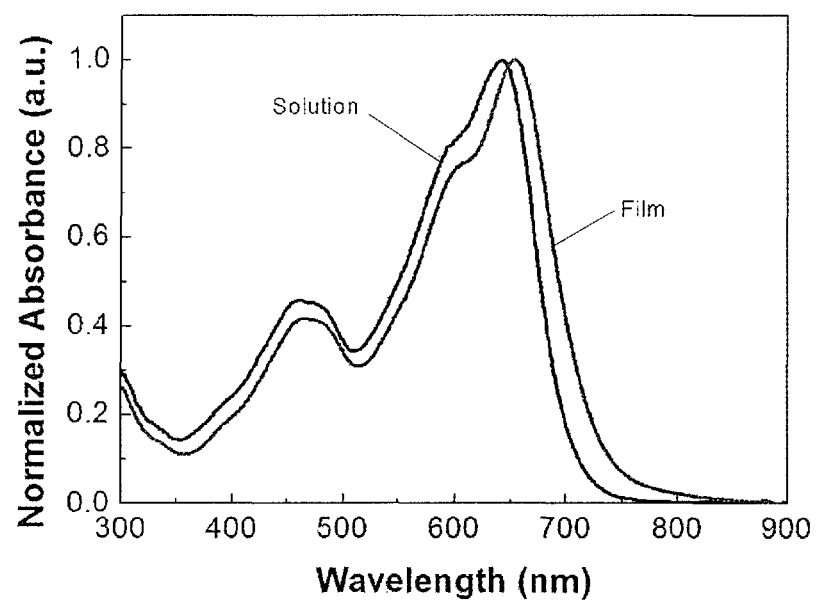
FIG. 1 shows the absorbance of PDFDB-HD (Example 1) according to an exemplary embodiment of the present disclosure in solution and film states.

Hereinafter, various aspects and exemplary embodiments of the present disclosure will be described in more detail.

In an aspect, to achieve high photoelectric conversion efficiency of an organic thin-film photovoltaic cell, the present disclosure provides a conductive low band gap polymer compound represented by Chemical Formula 1 using a benzodithiophene monomer and a thiophene monomer, which are reported as exhibiting superior hole mobility and high optical absorption:

Chemical Formula 1

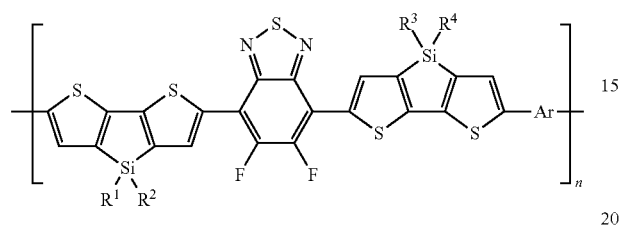

wherein
Ar is selected from a group consisting of

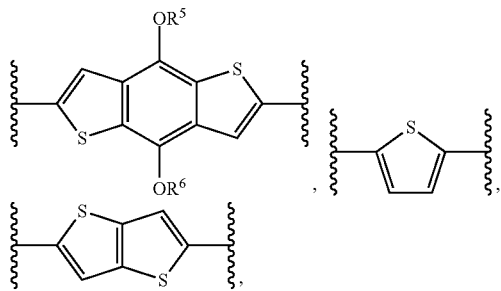

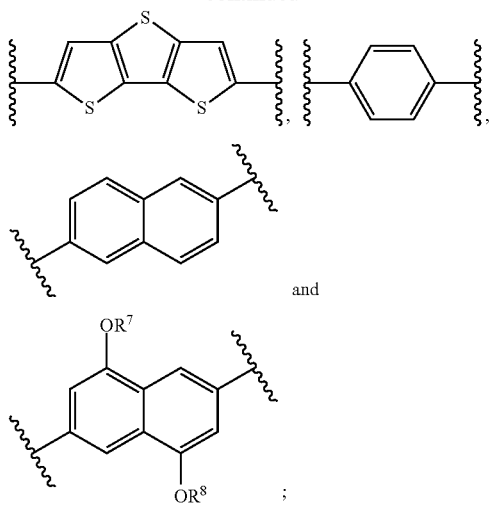

each of $R^1$ through $R^8$, which are identical or different, is independently a linear or branched $C_1$-$C_7$ alkyl group, linear or branched $C_8$-$C_{20}$ alkyl group, a linear or branched $C_1$-$C_7$ alkoxy group, a linear or branched $C_8$-$C_{20}$ alkoxy group or a $C_6$-$C_{20}$ aryl group; and n is an integer from 5 to 100,000.

In an exemplary embodiment of the present disclosure, each of the $R^1$ through $R^8$, which are identical or different, may be independently selected from a group consisting of ethylhexyl, butyloctyl, hexyldecyl and octyldodecyl and the n may be an integer from 100 to 50,000.

More specifically, the compound of Chemical Formula 1 may be one or more selected from

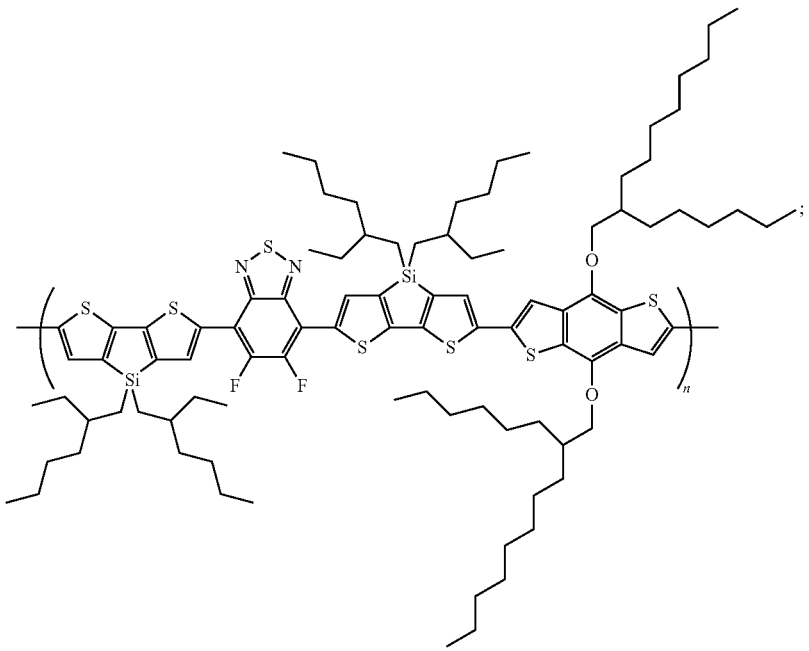

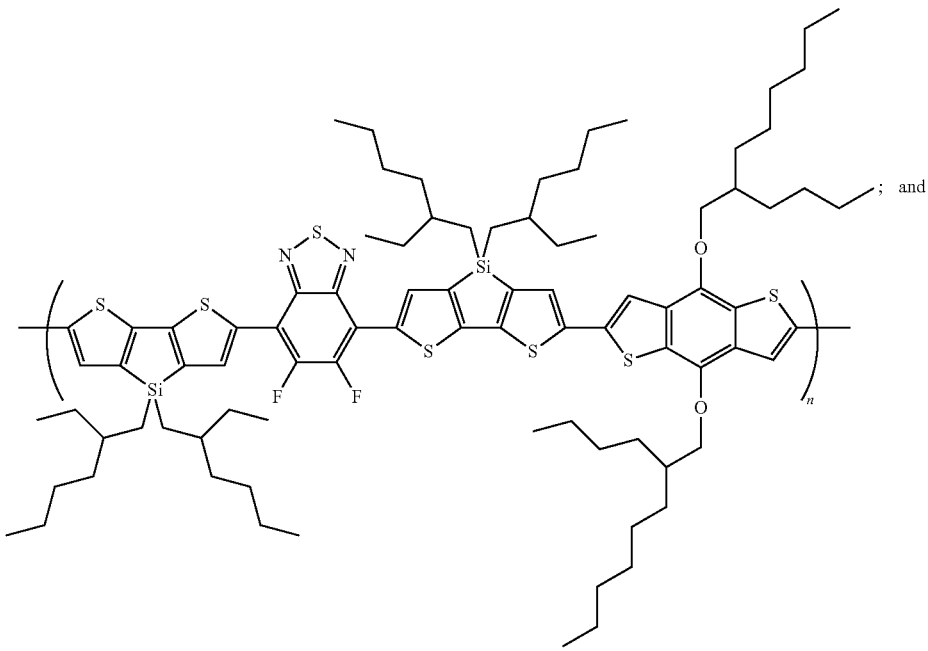

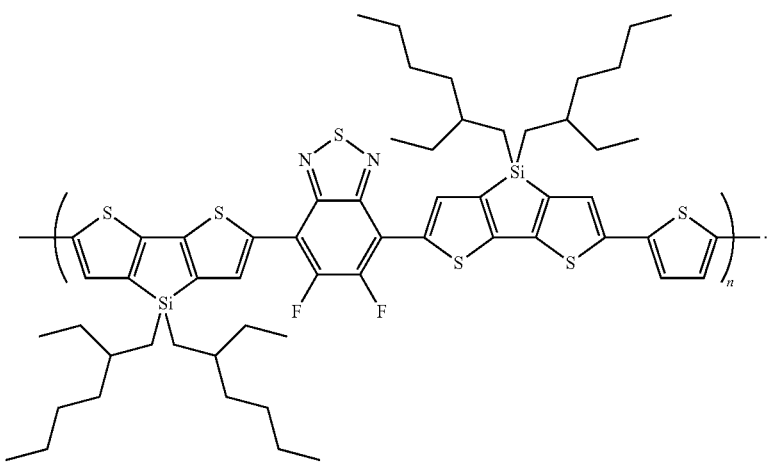

The planarity of conductive polymer compound according to the present disclosure may be ensured via noncovalent interaction between F and S (thiophene), which is expected to be greatly helpful in achieving high efficiency. In addition, since the conductive polymer compound exhibits very superior light stability, with a band gap of 5-6.5 eV as demonstrated in Test Example 1, it can be greatly helpful in ensuring the reliability of an organic photovoltaic cell. Accordingly, the conductive polymer compound can be usefully used as a material for an organic optoelectronic device selected from an organic photodiode (OPD), an organic light-emitting diode (OLED), an organic thin-film transistor (OTFT) and an organic photovoltaic cell.

In another aspect, the present disclosure provides a method for preparing a conductive polymer compound represented by Chemical Formula 1, including dissolving a compound represented by Chemical Formula 2 and a compound represented by Chemical Formula 3 in a reaction solvent and conducting reaction by adding a palladium catalyst according to [Scheme 1]:

[Scheme 1]

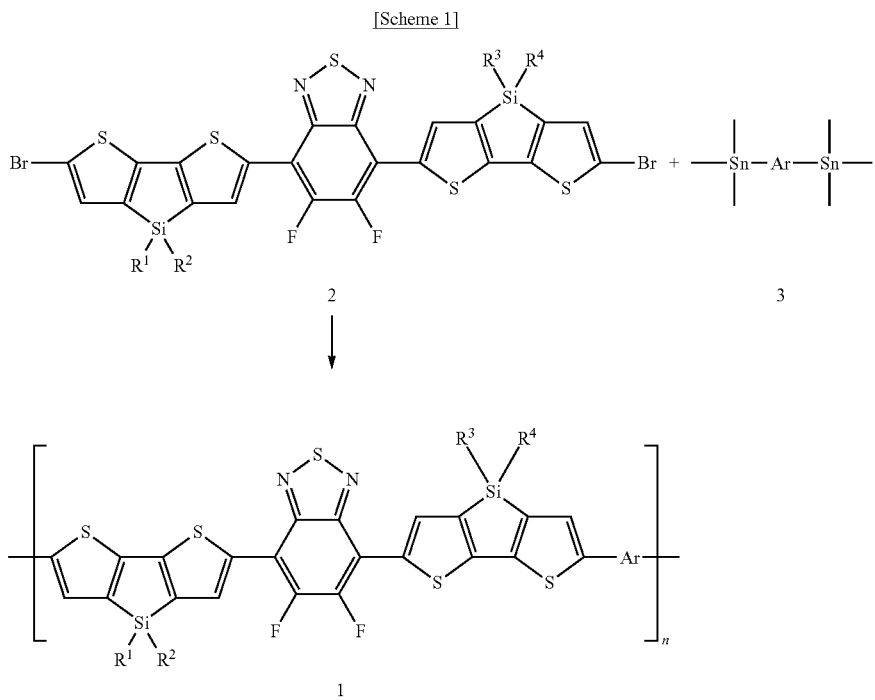

wherein $R^1$ through $R^4$, Ar and n are the same as defined in Chemical Formula 1 in claim 1.

In an exemplary embodiment of the present disclosure, the reaction solvent may be one or more selected from a group consisting of water, toluene, acetone, methanol, ethanol, tetrahydrofuran (THF), chlorobenzene and dimethylformamide (DMF).

And, the palladium catalyst may be selected from $PdCl_2$, $Pd(OAc)_2$, $Pd(CH_3CN)_2Cl_2$, $Pd(PhCN)_2Cl_2$, $Pd_2dba_3CHCl_3$ and $Pd(PPh_3)_4$.

In another aspect, the present disclosure provides an organic photovoltaic cell containing a polymer compound represented by Chemical Formula 1:

Chemical Formula 1

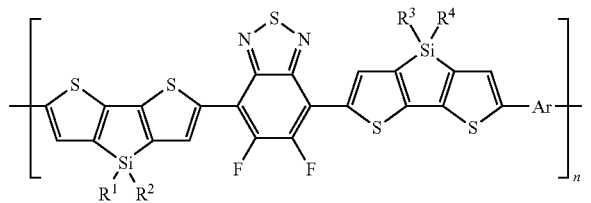

wherein Ar and n are the same as defined above.

In order to ensure high energy conversion efficiency of an organic photovoltaic cell, it is required that a large quantity of photons are be absorbed by a light absorption layer and excitons formed thereby are be effectively dissociated into holes and electrons at a donor-acceptor interface and the separated holes and electrons are be transported to an anode and a cathode without loss. Although there have been considerable improvement in energy conversion efficiency through efforts by researchers, the existing photovoltaic cell still has problems that it is not easy to control the factors that directly affect the performance of the photovoltaic cell, such as the molecular weight, polydispersity and stereoregularity, reproducibly and uniformly the synthesis or purification process is complicated and the charge mobility is low.

Since the conductive polymer compound for an organic photovoltaic cell of the present disclosure as a low band gap electron donor exhibits high photon absorptivity and superior hole mobility (see Test Examples 1 and 2) and the associated synthesis and purification processes are simple (see Example 1), it can be usefully used as a material for an organic optoelectronic device such as an organic photodiode (OPD), an organic thin-film transistor (OTFT), an organic light-emitting diode (OLED), an organic photovoltaic cell, etc.

In addition, by introducing an electron-withdrawing difluorobenzothiadiazole monomer to the conductive polymer compound according to the present disclosure, a low band gap polymer compound can be obtained. Accordingly, by using a fullerene such as $C_{60}$, $C_{70}$, $C_{74}$, $C_{76}$, $C_{78}$, $C_{82}$, $C_{84}$, $C_{720}$, $C_{860}$, etc. or a fullerene derivative such as PCBM ([6,6]-phenyl-$C_{61}$ butyric acid methyl ester), $C_{71}$-PCBM, $C_{84}$-PCBM, bis-PCBM, etc. as an n-type material, a bulk heterojunction-type photoelectric conversion layer for an organic photovoltaic cell may be formed.

Hereinafter, the present disclosure will be described in more detail through examples. However, the following examples are for illustrative purposes only and not intended to limit the scope of this disclosure.

PREPARATION EXAMPLE 1

Preparation of 4-(6-bromo-4,4-bis(2-ethylhexyl)-4H-silolo[3,2-b:4,5-b']dithiophen-2-yl)-7-(6-(5-bromothiophen-2-yl)-4,4-bis(2-ethylhexyl)-4H-silolo[3,2-b:4,5-b']dithiophen-2-yl)-5,6-difluorobenzo[c][1,2,5]thiadiazole

PREPARATION EXAMPLE 2

Preparation of (4,8-bis((2-hexyldecyl)oxy)benzo[1,2-b:4,5-b']dithiophene-2,6-diyl)bis(trimethylstannene)

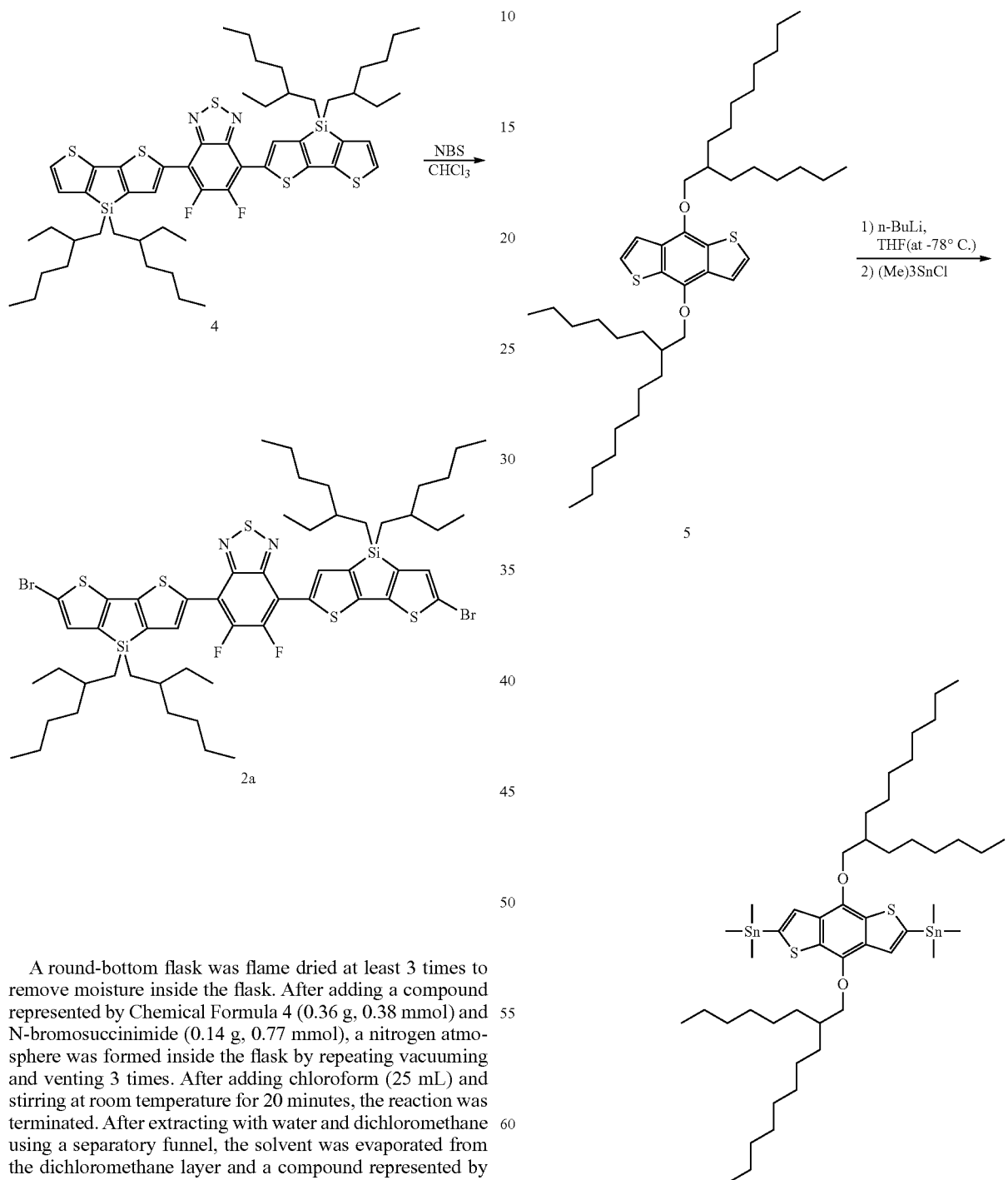

A round-bottom flask was flame dried at least 3 times to remove moisture inside the flask. After adding a compound represented by Chemical Formula 4 (0.36 g, 0.38 mmol) and N-bromosuccinimide (0.14 g, 0.77 mmol), a nitrogen atmosphere was formed inside the flask by repeating vacuuming and venting 3 times. After adding chloroform (25 mL) and stirring at room temperature for 20 minutes, the reaction was terminated. After extracting with water and dichloromethane using a separatory funnel, the solvent was evaporated from the dichloromethane layer and a compound represented by Chemical Formula 2a was obtained with a yield of 84% (0.33 g) through column chromatography using hexane.

$^1$H-NMR (400 MHz, CDCl$_3$): δ=8.26-8.24 (t, 2H), 7.04 (s, 2H), 1.28-1.17 (m, 36H), 1.16-0.96 (m, 124H).

MW: 1245.58 g/mol.

A round-bottom flask was flame dried at least 3 times and 4,8-bis((2-hexyldecyl)oxy)benzo[1,2-b:4,5-b']dithiophene (0.54 g, 0.80 mmol) dissolved in tetrahydrofuran (25 mL) was added. After lowering temperature to −78° C. or below using acetone and dry ice, followed by adding 1.6 M N-butyllithium (1.25 mL, 2.00 mmol) for 20-30 minutes dropwise and stirring for 1 hour, the mixture was stirred for 2 hours after adding trimethyltin chloride (2.00 mL, 2.00 mmol). After removing the acetone and dry ice and stirring for 12 hours, the reaction was terminated. After extracting with water and dichloromethane using a separatory funnel, the solvent was evaporated from the dichloromethane layer and a compound represented by Chemical Formula 3a was obtained with a yield of 68% (0.55 g) through reprecipitation using methanol.

$^1$H-NMR (400 MHz, CDCl$_3$): δ=7.49 (s, 2H), 4.16-4.15 (d, 4H), 1.86-1.80 (m, 2H), 1.66-1.29 (m, 36H), 0.94-0.86 (m, 36H), 0.42 (m, 36H).

MW: 996.75 g/mol.

PREPARATION EXAMPLE 3

Preparation of (4,8-bis((2-butyloctyl)oxy)benzo[1,2-b:4,5-b']dithiophene-2,6-diyl)bis(trimethylstannene)

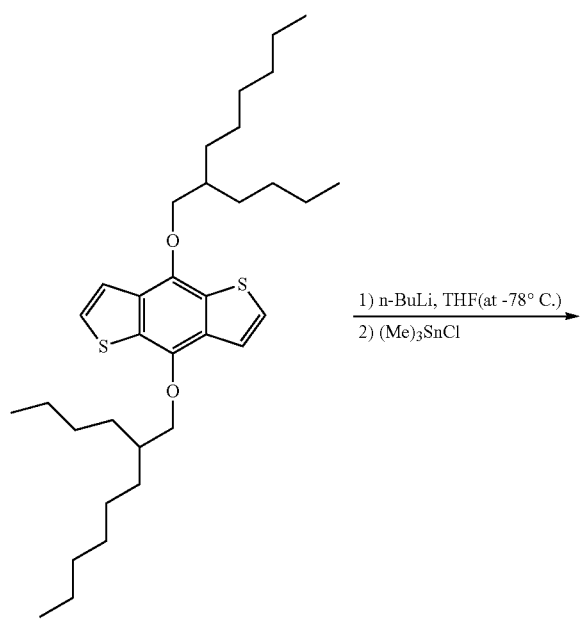

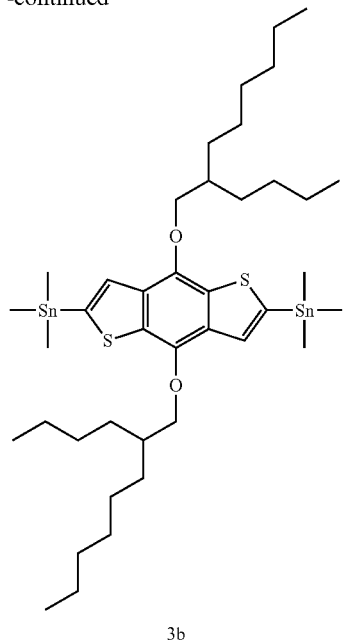

A compound represented by Chemical Formula 3b was obtained according to the same procedure described in Preparation Example 2 using 4,8-bis((2-butyloctyl)oxy)benzo[1,2-b:4,5-b']dithiophene instead of 4,8-bis((2-hexyldecyl)oxy)benzo[1,2-b:4,5-b']dithiophene.

$^1$H-NMR (400 MHz, CDCl$_3$): δ=7.49 (s, 2H), 4.16-4.15 (d, 4H), 1.86-1.80 (m, 2H), 1.66-1.29 (m, 36H), 0.94-0.86 (m, 12H), 0.42 (s, 18H).

MW: 884.54 g/mol.

PREPARATION EXAMPLE 4

Preparation of 2,5-bis(trimethylstannyl)thiophene

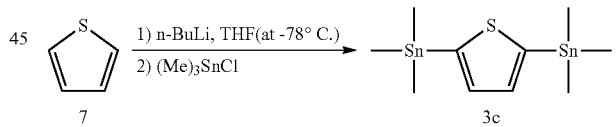

A round-bottom flask was flame dried at least 3 times and thiophene (1.0 g, 11.9 mmol) dissolved in tetrahydrofuran (100 mL) was added. After lowering temperature to −78° C. or below using acetone and dry ice, followed by adding 1.6 M N-butyllithium (17.1 mL, 27.37 mmol) for 20-30 minutes dropwise and stirring for 1 hour, the mixture was stirred for 2 hours after adding trimethyltin chloride (27.37 mL, 27.37 mmol). After removing the acetone and dry ice and stirring for 24 hours, the reaction was terminated. After extracting with water and dichloromethane using a separatory funnel, the solvent was evaporated from the dichloromethane layer and a compound represented by Chemical Formula 3c was obtained with a yield of 54% (2.63 g) through reprecipitation using methanol.

$^1$H-NMR (400 MHz, CDCl$_3$): δ=7.38 (s, 2H), 0.37 (s, 18H).

MW: 409.75 g/mol.

EXAMPLE 1

Preparation of PDFDB-HD

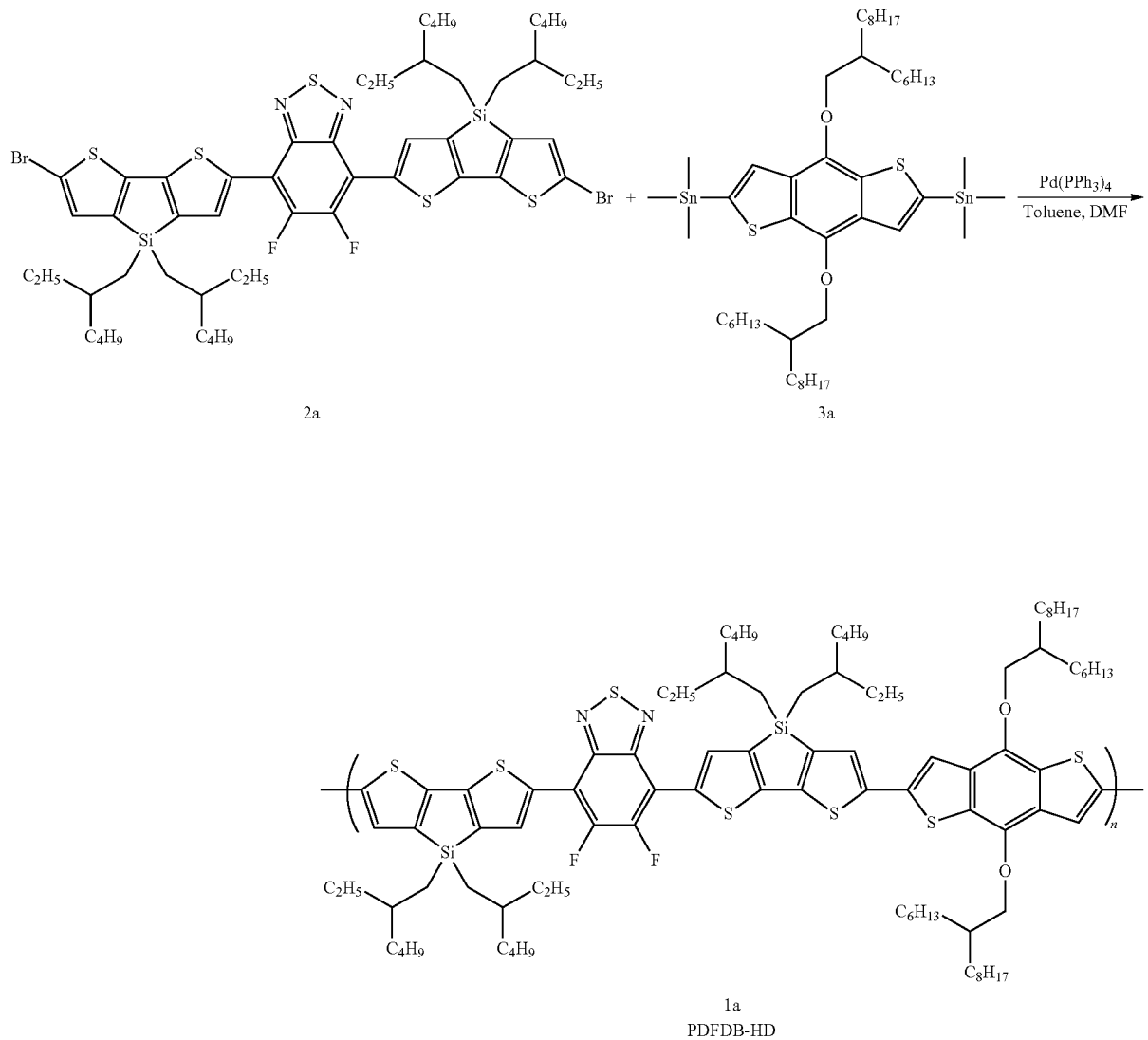

2a

3a

1a
PDFDB-HD

The compound represented by Chemical Formula 2a (0.33 g, 0.286 mmol) obtained in Preparation Example 1 and the compound represented by Chemical Formula 3a (0.28 g, 0.286 mmol) obtained in Preparation Example 2 were dehydrated for at least 12 hours and dissolved in degassed toluene (10 mL) and DMF (1 mL). After adding Pd(PPh$_3$)$_4$ (0.0099 g, 0.0086 mmol), the mixture was stirred at room temperature.

After the reaction started, the mixture was slowly heated to 60° C. 1 hour later, the mixture was slowly heated to 110° C. and reaction was carried out by stirring. 17 hours later, the reaction was terminated when the viscosity was increased. The reaction mixture added to a methanol:water (4:1) mixture and the produced polymer was reprecipitated with methanol. The precipitated substance was purified by Soxhlet extraction using methanol, hexane and acetone.

The remaining polymer was dissolved in chloroform and dried in vacuum to obtain a polymer compound represented by Chemical Formula 1a with a yield of 79% (0.380 g).

$^1$H-NMR (400 MHz, CDCl$_3$): δ=8.79-8.13 (s, 2H), 7.62-6.97 (m, 4H), 4.46-3.62 (m, 4H), 2.49-0.23 (m, 130H).

Molecular weight: M$_n$=39556 Dalton, M$_w$=63822 Dalton, PDI=1.61.

EXAMPLE 2

Preparation of PDFDB-BO

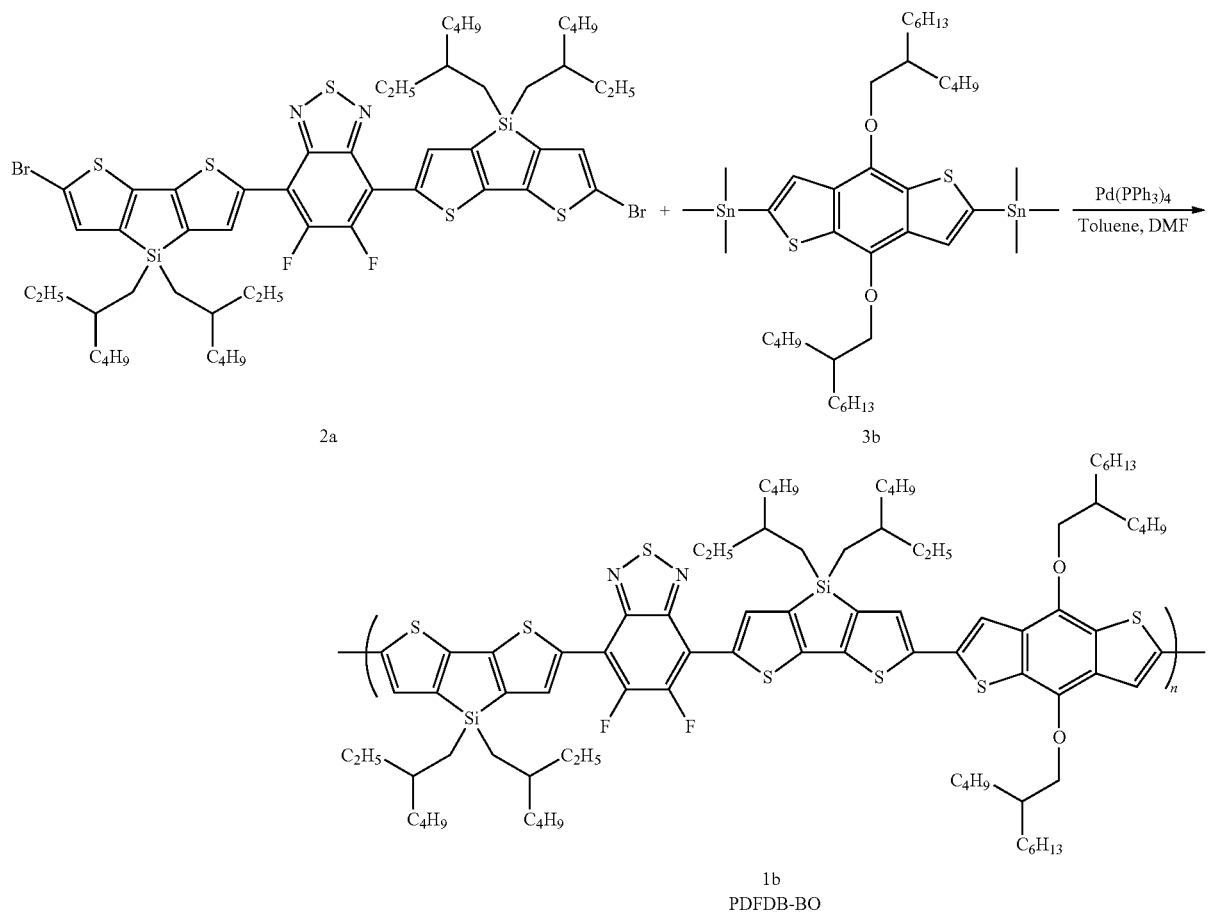

2a

3b

1b
PDFDB-BO

The compound represented by Chemical Formula 2a (0.3101 g, 0.2665 mmol) obtained in Preparation Example 1 and the compound represented by Chemical Formula 3b (0.2357 g, 0.2665 mmol) obtained in Preparation Example 3 were dehydrated for at least 12 hours and dissolved in degassed toluene (4.11 mL) and DMF (0.82 mL). After adding Pd(PPh$_3$)$_4$ (0.0123 g, 0.0107 mmol), the mixture was reacted by stirring at 120° C.

3 hours later, the reaction was terminated when the viscosity was increased. The reaction mixture added to a methanol:water (4:1) mixture and the produced polymer was reprecipitated with methanol. The precipitated substance was purified by Soxhlet extraction using methanol, hexane and acetone.

The remaining polymer was dissolved in chloroform and dried in vacuum to obtain a polymer compound represented by Chemical Formula 1b with a yield of 94% (0.380 g).

$^1$H-NMR (400 MHz, CDCl$_3$): δ=7.82-6.59 (m, 6H), 4.54-3.96 (m, 4H), 2.19-0.65 (m, 108H).

Molecular weight: M$_n$=43992 Dalton, M$_w$=164836 Dalton, PDI=3.75.

EXAMPLE 3

Preparation of PDFDT

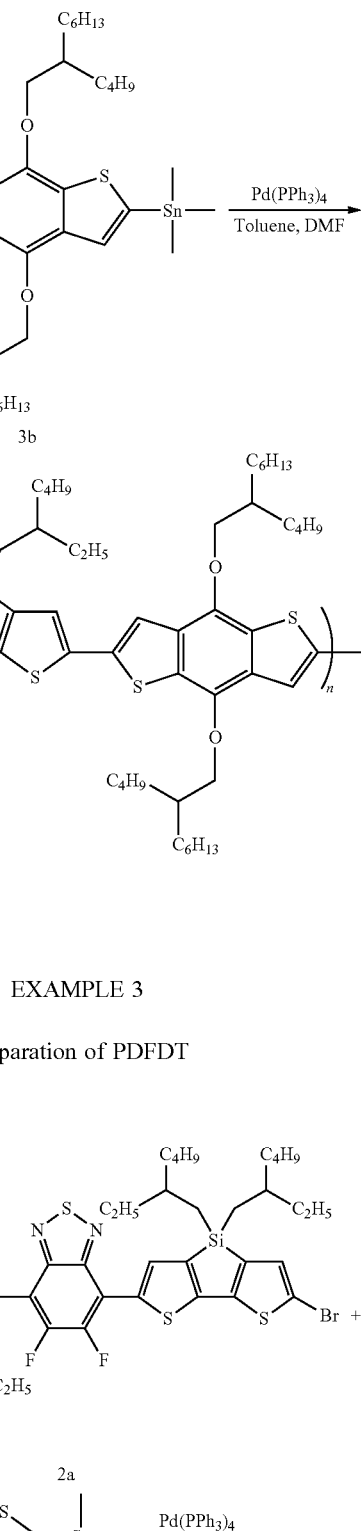

2a

3c

-continued

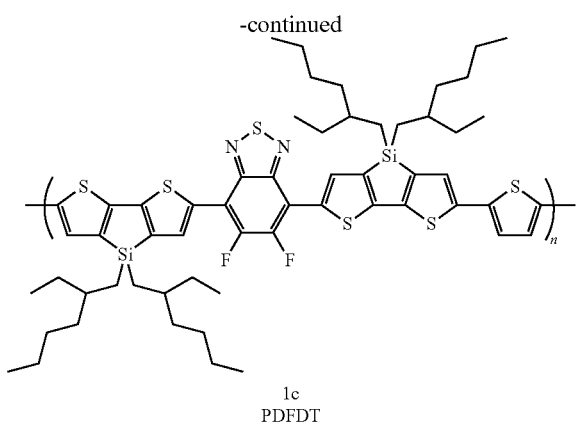

1c
PDFDT

The compound represented by Chemical Formula 2a (0.3502 g, 0.3010 mmol) obtained in Preparation Example 1 and the compound represented by Chemical Formula 3c (0.1233 g, 0.3010 mmol) obtained in Preparation Example 4 were dehydrated for at least 12 hours and dissolved in degassed toluene (5 mL) and DMF (1 mL). After adding Pd(PPh$_3$)$_4$ (0.0139 g, 0.0120 mmol), the mixture was reacted by stirring at 90° C.

2 hours and 20 minutes later, the reaction was terminated when the viscosity was increased. The reaction mixture added to a methanol:water (4:1) mixture and the produced polymer was reprecipitated with methanol. The precipitated substance was purified by Soxhlet extraction using methanol, hexane and acetone.

The remaining polymer was dissolved in chloroform and dried in vacuum to obtain a polymer compound represented by Chemical Formula 1c with a yield of 91% (0.298 g).

$^1$H-NMR (400 MHz, CDCl$_3$): δ=8.42-8.19 (s, 2H), 7.51-6.99 (m, 4H), 2.28-0.38 (m, 68H).

Molecular weight: M$_n$=29146 Dalton, M$_w$=60438 Dalton, PDI=2.07.

EXAMPLE 4

Preparation of Photovoltaic Cell 1

A photovoltaic cell with a structure of ITO/PEDOT:PSS/PDFDB-HD:PC$_{71}$BM (1:1.5)/Al was fabricated using the polymer compound PDFDB-HD obtained in Example 1.

An ITO substrate was washed with isopropyl alcohol for 10 minutes, with acetone for 10 minutes and then with isopropyl alcohol for 10 minutes and then dried before use.

A PEDOT:PSS solution diluted 1:1 with methanol was spin coated on the dried ITO substrate, which was then dried at 110° C. for 10 minutes. A solution of 1:1.5 of PDFDB-HD (10 mg) and PC$_{71}$BM (15 mg) in a 97:3 mixture (1 mL) of chlorobenzene and 1,8-diiodooctane was spin coated on the dried substrate at a rate of 1000 rpm and an aluminum electrode was deposited to a thickness of 100 nm.

EXAMPLE 5

Preparation of Photovoltaic Cell 2

A photovoltaic cell with a structure of ITO/PEDOT:PSS/PDFDB-BO:PC$_{71}$BM (1:1.5)/Al was fabricated using the polymer compound PDFDB-BO obtained in Example 2.

The fabrication procedure was the same as Example 4, except that solution of 1:1.5 of PDFDB-BO (8 mg) and PC$_{71}$BM (12 mg) was used instead of PDFDB-HD (10 mg) and PC$_{71}$BM (15 mg).

EXAMPLE 6

Preparation of Photovoltaic Cell 3

A photovoltaic cell with a structure of ITO/PEDOT:PSS/PDFDT:PC$_{71}$BM (1:1.5)/Al was fabricated using the polymer compound PDFDT obtained in Example 3.

The fabrication procedure was the same as Example 4, except that solution of 1:1.5 of PDFDT (8 mg) and PC$_{71}$BM (12 mg) was used instead of PDFDB-HD (10 mg) and PC$_{71}$BM (15 mg).

TEST EXAMPLE 1

Measurement of Optical Band Gap

The optical band gap of the polymer compounds according to the present disclosure was measured as follows.

Absorbance in solution state was measured using a UV-Vis spectrometer after dissolving the polymer compound in chloroform to 10$^{-5}$ M/cm (based on repeating units). Absorbance in solid state (i.e., film) was measured after spin coating the chloroform solution on a glass substrate.

TABLE 1

|           | Solution ($\lambda_{max}$) | Film ($\lambda_{max}$) | Optical band gap ($E_{g,opt}$) |
|-----------|-----------|-----------|-----------|
| Example 4 | 641 nm | 654 nm | 1.66 eV |
| Example 5 | 645 nm | 659 nm | 1.68 eV |
| Example 6 | 693 nm | 701 nm | 1.61 eV |

Figure 2:
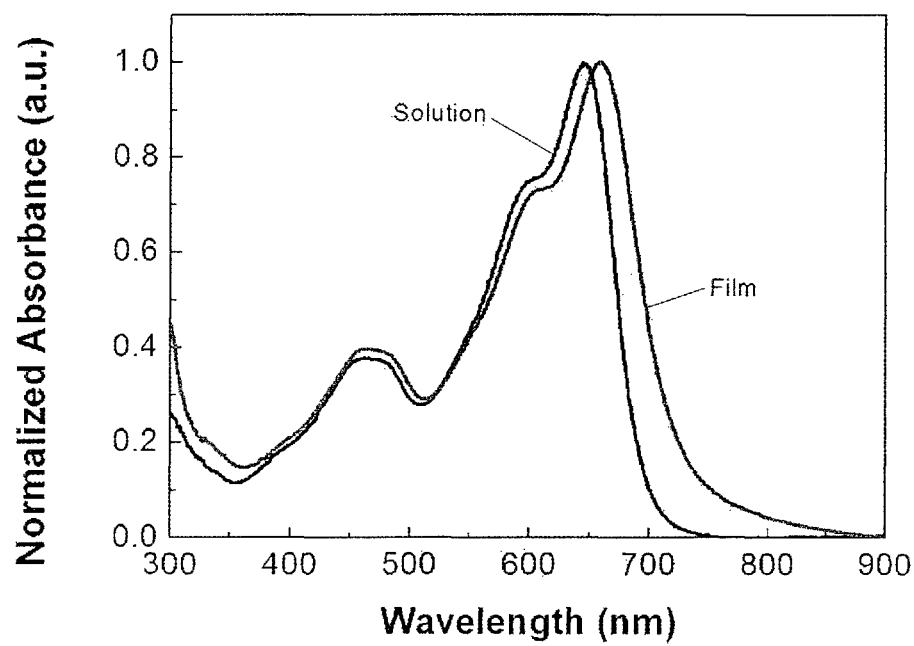
FIG. 2 shows the absorbance of PDFDB-BO (Example 2) according to an exemplary embodiment of the present disclosure in solution and film states.
Figure 3:
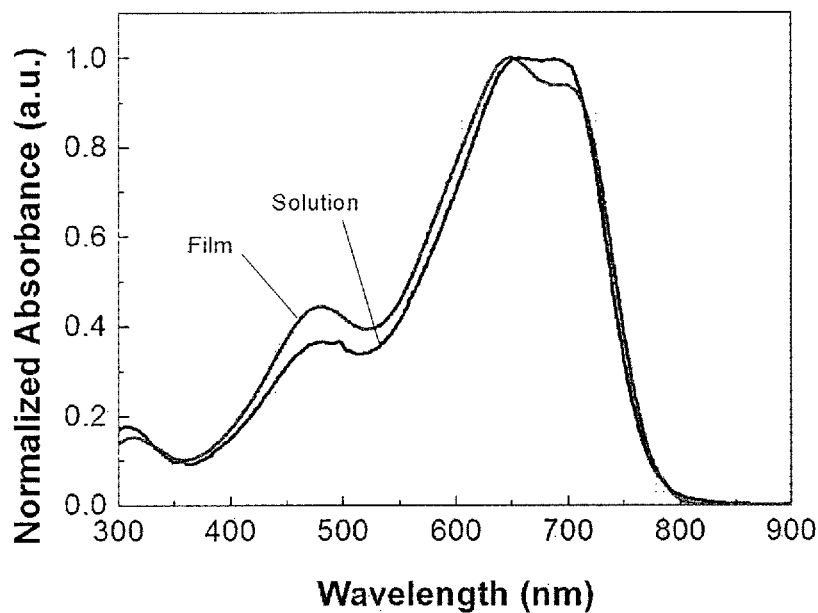
FIG. 3 shows the absorbance of PDFDT (Example 3) according to an exemplary embodiment of the present disclosure in solution and film states.

As seen from Table 1, the optical band gap of the conductive polymer compounds according to the present disclosure was measured to be 1.61-1.68 eV. The conductive polymer compounds according to the present disclosure showed decreased optical band gap in film state as compared to solution state because of packing between the polymers (see FIGS. 1-3). As a result, the polymer compounds were identified as low band gap materials suitable for providing high efficiency.

Accordingly, the polymer compounds can be usefully used as a material for an organic optoelectronic device selected from an organic photodiode (OPD), an organic light-emitting diode (OLED), an organic thin-film transistor (OTFT) and an organic photovoltaic cell.

TEST EXAMPLE 2

Evaluation of Performance of Organic Photovoltaic Cell Containing Polymer Compound The performance of organic photovoltaic cells containing the polymer compounds according to the present disclosure was evaluated as follows.

Among the electrochemical characteristics of the organic photovoltaic cells fabricated according to the present disclosure, fill factor and energy conversion efficiency were calculated according to Equation 1 and Equation 2.

Figure 4:
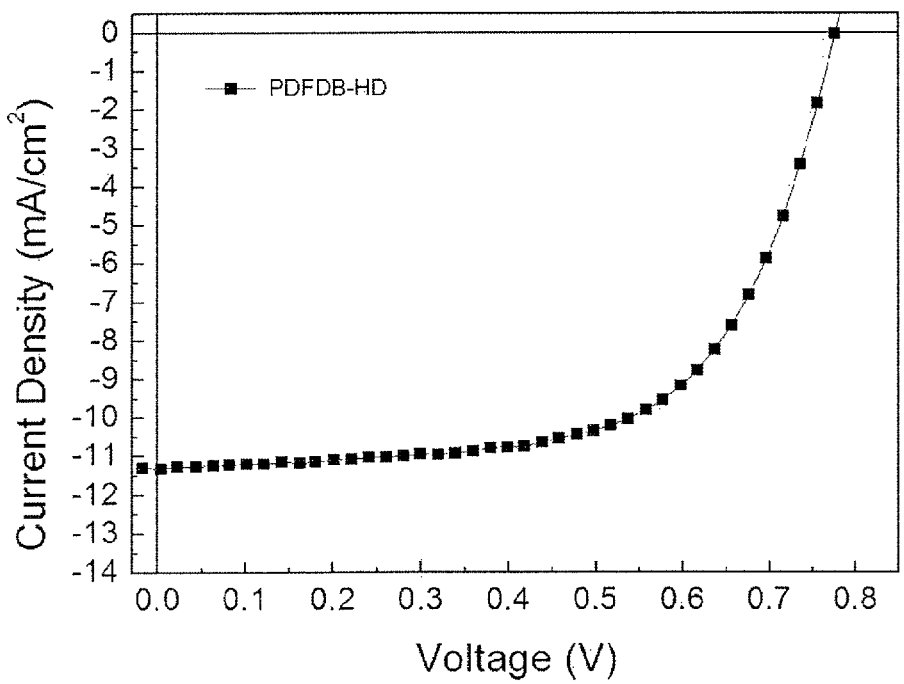
FIG. 4 shows the current density-voltage (J-V) curve of a PDFDB-HD (Example 4) photovoltaic cell according to an exemplary embodiment of the present disclosure.
Figure 5:
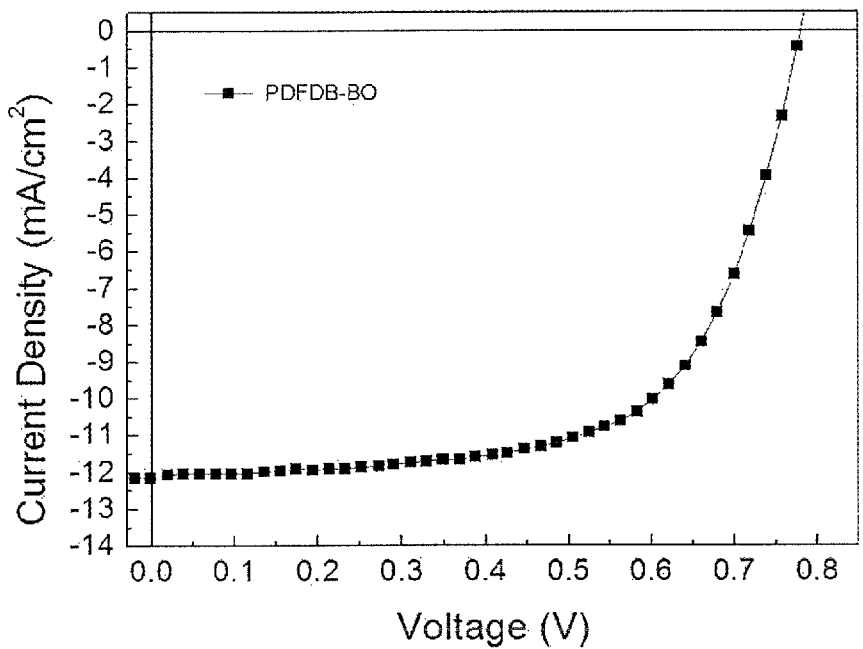
FIG. 5 shows the current density-voltage (J-V) curve of a PDFDB-BO (Example 5) photovoltaic cell according to an exemplary embodiment of the present disclosure.
Figure 6:
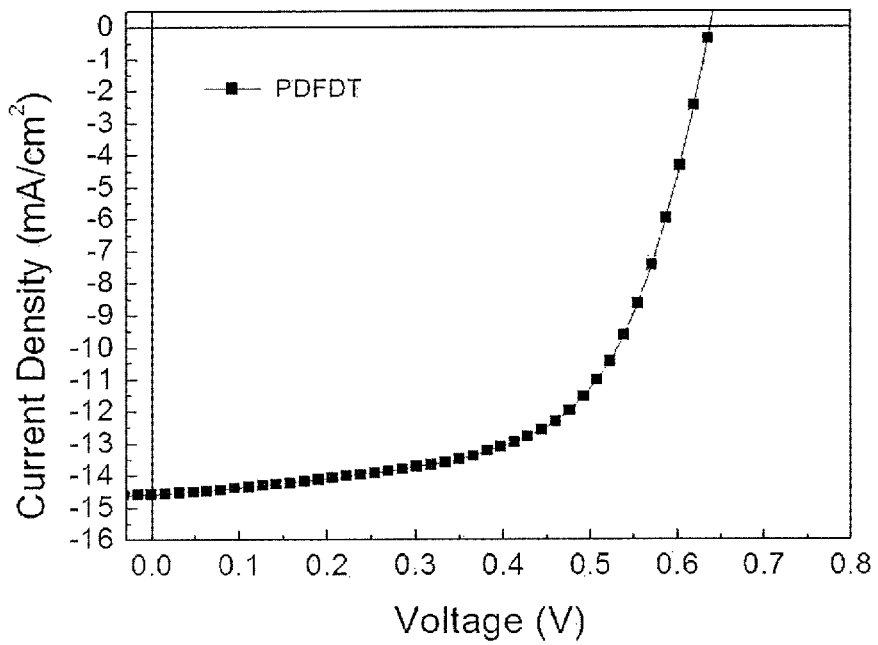
FIG. 6 shows the current density-voltage (J-V) curve of a PDFDT (Example 6) photovoltaic cell according to an exemplary embodiment of the present disclosure.
Figure 7:
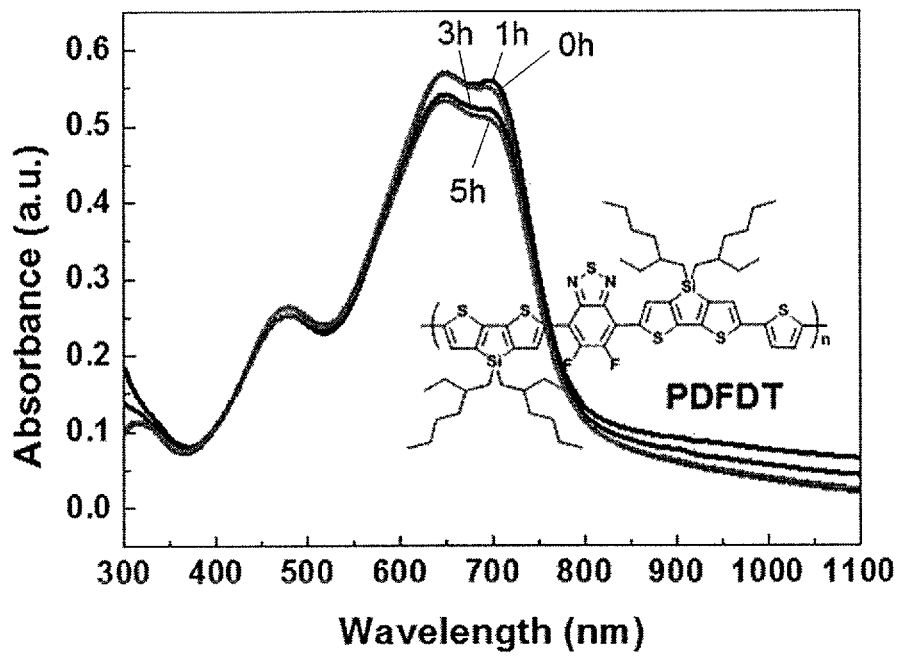
FIG. 7 compares the light stability of PDFDT (Example 3) according to an exemplary embodiment of the present disclosure with PTB7 as a polymer material commonly used in an organic photovoltaic cell.
Figure 7:
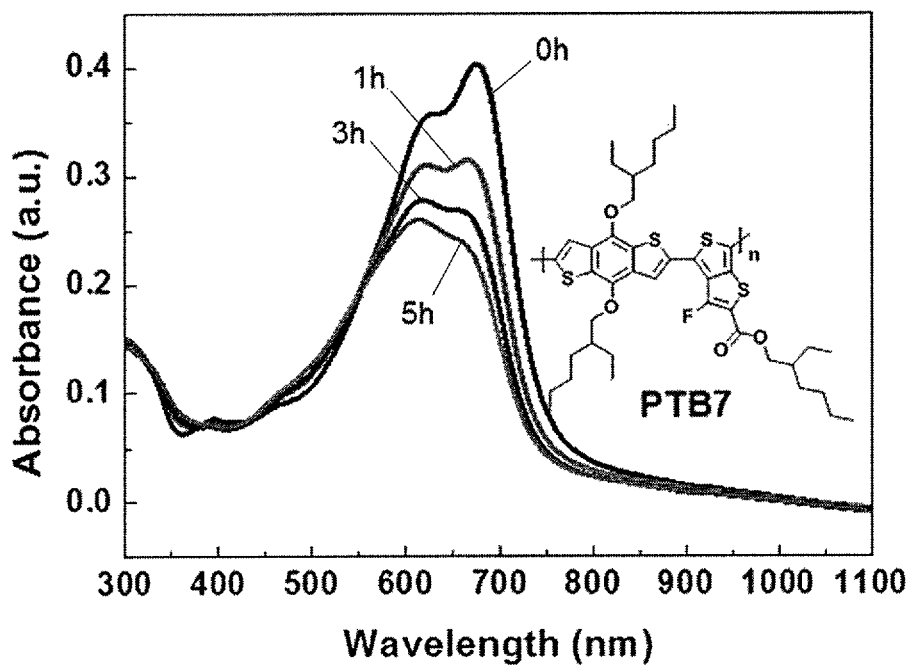

The result is shown in Table 2 and FIGS. 4-6.

$$\text{Fill factor} = (V_{mp} \times I_{mp})/(V_{oc} \times I_{sc}) \quad \text{Equation 1}$$

where $V_{mp}$ is the voltage at the maximum power point, $I_{mp}$ is the current at the maximum power point, $V_{oc}$ is the open circuit voltage and $I_{sc}$ is the short circuit current.

Energy conversion efficiency (%)=Fill factor×($J_{sc}$× $V_{oc}$)/100　　　Equation 2 where $J_{sc}$ is the short circuit current density and $V_{oc}$ is the open circuit voltage.

TABLE 2

|  | $V_{oc}$ (V) | $J_{sc}$ (mA/cm²) | FF | PCE (%) |
|---|---|---|---|---|
| Example 4 | 0.78 | 11.30 | 0.63 | 5.52 |
| Example 5 | 0.78 | 12.12 | 0.64 | 6.04 |
| Example 6 | 0.64 | 14.57 | 0.61 | 5.70 |

As seen from Table 2, the energy conversion efficiency of the organic photovoltaic cells according to the present disclosure was superior with about 5.5% or higher.

This result confirms that the conductive polymer compounds of the present disclosure are suitable for use in an organic photovoltaic cell and provide increased photon absorptivity and improved hole mobility.

As described above, the conductive polymer according to the present disclosure is useful as a low band gap electron donor for an organic photovoltaic cell and, since it exhibits high photon absorptivity and improved hole mobility, it can be usefully used as a material for an organic optoelectronic device such as an organic photodiode (OPD), an organic thin-film transistor (OTFT), an organic light-emitting diode (OLED), an organic photovoltaic cell, etc.

What is claimed is:

1. A conductive polymer compound represented by Chemical Formula 1:

Chemical Formula 1

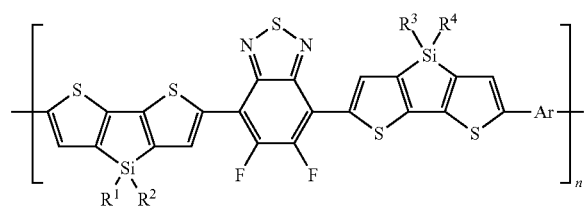

wherein

Ar is

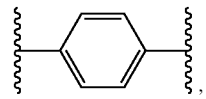 [SMILES: *c1ccc(*)cc1]

wherein each of $R^1$ through $R^4$, which are identical or different, is independently a linear or branched $C_1$-$C_7$ alkyl group, linear or branched $C_8$-$C_{20}$ alkyl group, a linear or branched $C_1$-$C_7$ alkoxy group, a linear or branched $C_8$-$C_{20}$ alkoxy group or a $C_6$-$C_{20}$ aryl group; and n is an integer from 5 to 100,000.

2. The conductive polymer compound according to claim 1, wherein each of the $R^1$ through $R^4$, which are identical or different, is independently selected from a group consisting of ethylhexyl, butyloctyl, hexyldecyl and octyldodecyl and the n is an integer from 100 to 50,000.

3. The conductive polymer compound according to claim 1, wherein the conductive polymer compound has a molecular weight of 500-10,000,000.

4. The conductive polymer compound according to claim 1, wherein the conductive polymer compound is a low band gap electron donor for an organic photovoltaic cell having a band gap of 5-6.5 eV.

5. An organic photovoltaic cell comprising the conductive polymer compound represented by Chemical Formula 1 according to claim 1.

6. The organic photovoltaic cell according to claim 5, wherein the conductive polymer compound represented by Chemical Formula 1 is contained in a photoconversion layer.

7. The organic photovoltaic cell according to claim 6, wherein a fullerene derivative is further contained in the photoconversion layer.

* * * * *